United States Patent [19]
Liu et al.

[11] Patent Number: 5,147,826
[45] Date of Patent: Sep. 15, 1992

[54] LOW TEMPERATURE CRYSTALLIZATION AND PATTERING OF AMORPHOUS SILICON FILMS

[75] Inventors: Gang Liu; Ramesh H. Kakkad; Stephen J. Fonash, all of State College, Pa.

[73] Assignee: The Pennsylvania Research Corporation, University Park, Pa.

[21] Appl. No.: 563,232

[22] Filed: Aug. 6, 1990

[51] Int. Cl.$^5$ .......................................... H01L 21/324
[52] U.S. Cl. .................................. 437/233; 437/967; 437/973; 156/603
[58] Field of Search ............... 437/247, 233, 967, 973; 148/DIG. 122; 156/603, 605; 136/258

[56] References Cited

U.S. PATENT DOCUMENTS

| | | | |
|---|---|---|---|
| 4,132,571 | 1/1979 | Cuomo et al. | 148/115 |
| 4,358,326 | 11/1982 | Doo | 148/174 |
| 4,379,020 | 4/1983 | Glaeser et al. | 156/603 |
| 4,433,202 | 2/1984 | Maruyama et al. | 136/258 |
| 4,693,759 | 9/1987 | Noguchi et al. | 437/24 |
| 4,814,292 | 3/1989 | Sasaki et al. | 437/101 |
| 4,902,642 | 2/1989 | Mao et al. | 437/83 |
| 4,904,611 | 2/1990 | Chiang et al. | 437/21 |

FOREIGN PATENT DOCUMENTS

| | | | |
|---|---|---|---|
| 57-194518 | 11/1982 | Japan | 437/233 |
| 63-193520 | 8/1988 | Japan | 437/233 |
| 1-248511 | 10/1989 | Japan | 437/233 |

OTHER PUBLICATIONS

Becker et al., "Low Resistance Polycrystalline silicon by boron or arsenic implantation and thermal crystallization of amorphously deposited films", J. Appl. Phys, 56(4), Aug. 15, 1984, pp. 1233-1236.

Kwizera et al., "Solid phase epitaxial recrystallization of thin polysilicon films amorphized by silicon ion implantation", Appl Phys. Lett. 41(4), Aug. 15, 1982, pp. 379-381.

Morin et al., "Polysilicon transistors on glass by pulsed-laser annealing", J. Appl. Phys. 53(5), May 1982, pp. 3897-3899.

Wada et al., "Grain Growth Mechanism of Heavily Phosphorus-Implanted Polycrystalline Silicon", J. Electrochem. Soc.: Solid-State Science and Technology, Sep. 1978 pp. 1499-1504.

Murota et al., "Electrical characteristics of Heavily arsenic and phosphorus doped polycrystalline silicon," J. Appl. Phys. 53(5), May 1982, pp. 3702-3706.

Crystallized Si films by low temerature rapid thermal annealing of amorphous silicon R. Kakkad, J. Smith, W. S. Lau, S. J. Fonash Journal of Applied Phys 65(5) p. 2069, 1989.

Large grain polycrystalline silicon by low-temperature annealing of low pressure chemical vapor deposited amorphous silicon films Miltiadis K. Itatalis and David W. Greve Journal of Applied Phys 63(7) p. 2260 1988.

Grain growth studies in Polysilicon by AR ion Implantation and Thermal Annealing Anjan Bhattacharyya and Kenneth N. Ritz J. of Electrochem Soc. 131(9) p. 2143 1984.

Recrystallization of Amorphous polycrystalline silicon films on $SiO_2$ Temperature dependence of the crystallization parameter R. B. Iverson and R. Raif Journal of Applied Phys 62(5) p. 1675 1987.

Primary Examiner—Olik Chaudhuri
Assistant Examiner—O. Fourson
Attorney, Agent, or Firm—Thomas J. Monahan

[57] ABSTRACT

The 700° C./4 min. rapid thermal anneal described in the prior art for converting amorphous Si to polycrystalline Si can be reduced to a temperature range of from 550° C. to 650° C. This is accomplished by depositing a very thin discontinuous film of a nucleating site forming material over the amorphous Si prior to rapid thermal anneal. Furthermore, by selectively depositing the material in a pattern, only that amorphous Si beneath the deposited pattern is caused to crystallize during annealing, while the remaining areas of amorphous Si remain in the amorphous state.

11 Claims, No Drawings

LOW TEMPERATURE CRYSTALLIZATION AND PATTERNING OF AMORPHOUS SILICON FILMS

FIELD OF THE INVENTION

This invention relates to a method for crystallizing amorphous silicon into large grain polycrystalline silicon films and more particularly, to a method for achieving selective crystallization of such films.

BACKGROUND OF THE INVENTION

A factor in the rapid increase in the use of integrated circuits is the development of high density metal-oxide-semiconductor (MOS) integrated circuits, which allow complex logic or large dense memories to be built on a single silicon chip. The use of polycrystalline Silicon (poly Si) as a gate-electrode material is a key to the fabrication of dense MOS chips. Poly Si also finds use in bipolar circuits where, again, device characteristics and device density are improved by its use. Interconnections for integrated circuits are also made using low resistivity doped poly Si. In addition, research is underway to fabricate high mobility, poly Si, thin film transistors (TFT) for use in display technology.

For TFT applications, poly Si should have high carrier mobilities. For MOS gate-electrodes and for interconnections in integrated circuits, the poly Si used must have the highest possible conductivity. To enhance the conductivity achievable with a given doping, it is necessary to suppress grain boundary segregation, to enhance doping activation, and to enhance carrier mobility. Increasing grain size will reduce grain boundary segregation since, relatively speaking, it leads to less grain boundary regions. Increasing grain size will also enhance mobility, since, for the same reason, it leads to less grain boundary scattering. Annealing temperatures close to or in excess of 1000° C. or, alternatively, long annealing times of the order of 100 hours, are used to achieve increased grain sizes in polycrystalline films. A standard procedure is to deposit the film at a temperature of 500°-600° C. in either amorphous or microcrystalline form and then to anneal the film in the 1000° C. range, for times on the order of an hour. An alternative known approach is to anneal at temperatures greater than 550° C.; however, this requires annealing times on the order of days.

An indication of processing techniques currently used to obtain polycrystalline thin films with acceptable grain sizes can be obtained by considering the work of Becker et al. and Hatalis et al. Becker et al. (J. Appl. Phys., Vol 56(4), p. 1233 (1984)) used low pressure chemical vapor deposition (LPCVD) to deposit amorphous Si (a-Si) and polycrystalline silicon (poly-Si) films in the temperature range of 560°-630° C., and then subsequently annealed those films at 950° C. for 30 minutes. The grain sizes for such films, after annealing were in the 700-2000 Angstrom range. Hatalis et al. (J. App. Phys., Vol 63(7), p. 2260 (1988)) also used LPCVD a-Si deposited at 545° C., but used an annealing temperature of 550° C. In this case, it took 72 hours of annealing to obtain 0.5 micrometer size grains.

Another approach to obtaining large grain polycrystalline silicon films involves amorphization of small grain poly Si films using ion implantation and a subsequent thermal annealing to obtain large grains. Bhattacharyya et al. (J. Electrochem. Soc., Vol 131(9), p. 2143 (1984)) used amorphization by Ar ion implantation and subsequent 900°/30 min. annealing of LPCVD poly Si films deposited at 620° C. In such an approach, the grain size after annealing was about 0.75 micrometer. Kwizera et al. (J. Appl. Phys. Lett, Vol 41(4), p. 379 (1982)) used LPCVD poly Si films deposited at 620° C., which were then amorphized using Si ion implantation and annealed at the temperature of 525° C. However, it took 144 hours to obtain 1 micro meter grains.

In general, amorphization prior to annealing results in larger grains compared to other previously described methods, but it faces the same problems seen in the other approaches: annealing temperatures of the order of 1000° C. for about one hour or lower annealing temperatures for times on the order of 100 hours. Processing steps requiring temperatures of the order of 1000° C. are becoming more undesirable in integrated circuit fabrication, and they are intolerable in applications such as display technologies, which may use inexpensive substrates such as glass. Processing steps requiring annealing times of the order of 100 hours are not practical for mass production.

A rapid thermal technique, differing substantially from the invention described here, that can produce large grain polycrystalline silicon is laser annealing. Morin et al. (J. Appl. Phys. Vol 53(5), p. 3897 (1982)) used a ruby laser to crystallize glow-discharge a Si films. The grain size obtained after the laser exposure was in the 1500-Angstrom range. However, the problems associated with laser annealing include throughput and uniformity.

In order to produce doped poly Si, films can be doped during deposition or by ion implantation or diffusion after deposition. To achieve the highest possible conductivity for a given doping, it is necessary to have a large grain size, as mentioned above. In the art, as now practiced, annealing temperatures on the order of 1000° C. are generally used to increase the grain size of doped films. Wada et al. (J. Electrochem. So, Vol. 125(9), p. 1499 (1978)) used chemical vapor deposited (CVD) poly Si films deposited at 630° C. and implanted with $7.5 \times 10^{20}$ $cm^{-3}$ phosphorus as a precursor material for a large grain doped poly Si. Annealing was performed at 1100° C. for 20 minutes, and the grain size, after annealing, was approximately 2.5 micro meter. Murota et al. (J. Appl. Phys, Vol. 53(5), p. 3702 (1982)) used gas phase doped poly Si as a precursor material to obtain high conductivity films. The films were doped with phosphorus by introducing $PH_3$ into the reaction chamber during film deposition at a substrate temperature of 730° C. Films were then annealed at 1100°-1200° C. for 30 minutes. Resulting films had the very low resistivity value of $5 \times 10^{-4}$ uhm-centimeter. The grain size of the films was 0.3 micro meter.

More recently, it has been shown that the deposition of a precursor a-Si can be achieved at a temperature of approximately 250° C., using plasma-enhanced chemical vapor deposition (PECVD). Additionally, the annealing process to produce poly Si has been reduced to minutes of exposure at temperatures less than 700° C. The rapid thermal annealing (RTA) was achieved in one of two ways. One used tungsten-halogen bulbs and the other used quick furnace exposures. Both methods produced undoped and highly doped polycrystalline films of excellent quality. That work is summarized in Kakkad et al., "Crystalized Si Films by Low-Temperature Rapid Thermal Annealing of Amorphous Si", Journal of Applied Physics, Vol. 65, No. 5, Mar. 1, 1989, pages 2069-2072. Notwithstanding the developments, as reported by Kakkad et al., it remains important to reduce, as far as possible, the thermal annealing temperatures for poly Si. Additionally, it is important to be able to selectively crystallize a-Si into high quality poly Si patterns in a-Si. The use of laser annealing to achieve this result is too slow for production applications. A rapid process would have many applications, including the production of self isolated devices, i.e., patterned regions of poly Si surrounded by high resistivity a-Si. Such a process could allow a-Si to be formed into high quality poly Si driver circuits and, in predetermined regions, to remain as a-Si for sensor or TFT pixel switches. Such a process could also allow the same a-Si precursor to give rise to poly Si which could be exploited for its mobility or dopability, and to a-Si which could be exploited for its photoconductivity or very high resistivity.

Accordingly, it is an object of this invention to provide a method for annealing a-Si to poly Si at temperatures lower than heretofore reported.

It is another object in this invention to provide a simple and inexpensive method for achieving patterned poly Si by selective crystallization of a-Si.

SUMMARY OF THE INVENTION

In accordance with the above objects, it has been found that the 700° C./4 min. rapid thermal anneal described by Kakkad et al. for converting a-Si to poly Si can be reduced to a temperature range of from 550° C. to 650° C. This is accomplished by depositing a very thin discontinuous film of a nucleating site forming material over the a-Si prior to RTA. Furthermore, by selectively depositing the material in a pattern, only that a-Si beneath the deposited pattern is caused to crystallize during annealing, while the remaining areas of a-Si remain in the amorphous state.

DETAILED DESCRIPTION OF THE INVENTION

Prior to describing the details of the invention, some brief description of the process of crystallization is useful. Crystallization includes two steps: nucleation and grain growth. In the case of films deposited as a polycrystalline material, the controlling factor in trying to get large-grain material is grain growth, because there is an ample number of nuclei present as well as pre-existing grains. In such poly Si films, grain size is limited by impingement of primary grains. Hence, to obtain large grains in such films, very high temperatures have been needed to grow secondary grains.

In the approach described by Kakkad et al, i.e. that of using an amophorous a-Si film as a precursor material, the controlling factor in producing large-grain material is nucleation. In a homogenous material such as high quality hydrogenated a-Si, the nuclei, as soon as they are formed, have much more freedom to grow in the precursor film before they impinge on each other. Thus the key point for obtaining large-grain poly Si from precursor a-Si films is that the density of the grain nuclei must be controlled. The ideal condition for large-grain growth, therefore, is a relatively low density of nuclei in a uniform amorphous background. The approach described herein obtains low density crystal nuclei and, at the same time obtains large-grain crystallization at low temperatures by employing a surface film to control nucleation. This invention uses a discontinuous, ultra-thin, surface film of a nucleating site forming material that generates crystal nucleating sites, for an a-Si film. Using this technique, the density of nuclei can be controlled by controlling the area of coverage of the ultra-thin surface film.

Deposited a-Si films, produced at low temperatures are used as the precursor material to yield large grain poly Si by rapid thermal annealing at temperatures of 700° C. or below for periods of up to five minutes. In the examples described below, precursor a-Si films were deposited by plasma enhanced chemical vapor deposition (PECVD) or by sputtering at a temperature of 250° C. or below. Grain sizes were large; for example on the order of 0.5–1.0 micrometers for undoped 2000 Angstrom thick films. For films which were doped with phosphorous at a level of $10^{20}$–$10^{21}$ cm$^{-3}$, grain sizes were approximately 3 micrometer. In the case of the doped films, the resistivities achieved were as low as any reported for doped polycrystalline silicon. In addition, it was found that a-Si films annealed in an oxygen ambient crystallized at lower temperatures than those annealed in argon or other inert ambients for the same annealing time. Further, a surface treatment comprising the deposition of discontinuous films of nucleating site forming materials (e.g. palladium or nickel) of approximately 10–80 Angstroms in thickness on the top of an a-Si precursor, prior to annealing, was used to enhance nucleation therebeneath. It was also found that the surface treatment reduced the crystallization temperature of the underlying poly Si by 50° C. or more, for the same anneal time. Because of the difference in temperatures needed for crystallization of the region beneath the nucleating film and the region not under the nucleating film, a pattern crystallization was achieved on a-Si films by using patterned ultra-thin discontinuous materials.

The deposition of nickel or palladium ultra-thin discontinuous films enhances the nucleation of poly Si therebeneath. The thermal budget for such crystallization was lowered by at least 50° C. and regions that did not receive this nucleation enhancing surface treatment would not crystallize at these lower temperatures. The observed surface treatment crystallization temperatures can be summarized as follows: microcrystalline films could be obtained at anneal temperatures at low as 550° C. for five minutes with the nickel or palladium surface treatment. Large grain poly Si, with grains as large as those producible at 700° C./4 minute anneal times (without surface treatment), could be produced at 650° C. for five minutes with the surface treatment.

When an ultra-thin layer of a nucleating site forming material is deposited on a-Si, microscopic examination shows a noncontinuous film comprised of independent, separated globules of the material. It appears that these globules serve as points which dictate where crystalline nucleations commence during a subsequent anneal procedure. Further, although not certain, the globules may heat-up faster than the surrounding surface, thus locally enhancing the crystallization procedure. In any event, it is clear that the globules serve as crystal nucleation points which enable selective creation of poly Si beneath the deposited material. While palladium and nickel are preferred materials for the invention, other nucleating site forming materials which can be deposited as thin discontinuous films are also contemplated for use herewith.

The thermal budget for crystallization of non-surface treated doped a-Si films was found to be 700° C. for three minutes, in an argon ambient during rapid thermal anneal. The grain size was found to be on the order of 3 micrometers for a 2000 Angstrom film, which is larger than the values obtained in the reports in the literature using much higher processing temperatures. Similar grain size was obtained for films doped during deposition. The lowest resistivity value obtained was $6 \times 10^{-4}$ ohm-cm which is comparable to the lowest value reported.

When oxygen was used as the ambient, it was found that the anneal temperature could be reduced from 700° C. to 685° C. for 2000 A/a-Si films. With thinner a-Si films, lower anneal temperatures are obtainable in oxygen ambients.

Further, the earlier work of Kakkad et al. accomplished doping of the a-Si during deposition. It is preferable to accomplish the introduction of the dopant species subsequent to a-Si deposition so that it can be selectively applied to the film (i.e. by implantation or diffusion through a mask), rather than incorporated into the total film. Also, the previously reported depositions of a-Si have been via plasma enhanced CVD processes. It has been found that sputtering enables relatively low temperature depositions of a-Si which crystallize to poly Si upon a subsequent low-temperature anneal. Sputtering also has the advantage that the substrate is not in contact with a plasma. Such contact could damage pre-existing structures in the substrate.

EXAMPLE 1

Amorphous silicon (a-Si) films were deposited on borosilicate glass (Corning 7059) or pyrex substrates at 250° C. or below using the DC or RF PECVD technique or sputtering. (A) in the case of films produced by a DC discharge, silane was flowing at 120 sccm at 0.5 torr, discharge current density was 0.13 ma/cm$^2$, and the film growth rate was 3.7 Angstrom/sec with a final thickness of 5600 Angstrom ($5.6 \times 10^{-5}$ cm). (B) In case of the RF discharge, a 13.56 MHz power at 14 mW/cm$^2$ was used to generate a silane plasma. Silane flow rate was 120 sccm at 0.5 torr and the film growth rate was 3.1 Angstrom/sec with final thickness of 2000 Angstrom ($2 \times 10^{-5}$ cm). (C) RF discharge films doped during growth were produced by flowing PH$_3$ into the reaction chamber during RF discharge deposition with a PH$_3$/SiH$_4$ gas phase ratio of 1.7. (D) For RF discharge films doped after growth, P ion implantation was utilized. The implantation was carried out at 50 Kev ion energy and for ion dosage rates of $5 \times 10^{15}$, $1 \times 10^{16}$, $2 \times 10^{16}$ cm$^{-2}$, to yield doping concentrations of $2.5 \times 10^{20}$, $5 \times 10^{20}$, and $1 \times 10^{21}$ cm$^{-3}$, respectively. (E) In the case of sputtered a-Si, the films were deposited at 230° C. using magnetron sputtering.

All the samples were crystallized using an AG Associates Heatpulse ™ 210 rapid thermal annealing system. The samples were placed on a silicon wafer during annealing to enhance uniformity in heating. Crystallization required annealing temperatures of 700° C. or less and times of 4 minutes or less. The temperature was measured by thermocouples. The crystallization processes were done in either argon or oxygen atmospheres.

EXAMPLE 2

For patterned crystallization, a surface treatment was applied to the a-Si film prior to RTA to enhance nucleation. Using films deposited in the same manner as Example 1, an additional surface layer of ultra thin metal was thermally evaporated onto the material. Two metals, palladium or nickel, were used. The thickness of the Pd and Ni was less than 50 Angstrom ($5 \times 10^{-7}$ cm). Patterning was effected by using a shadow mask during evaporation of the surface treating metal or by using photolithography after evaporation. A crystallized pattern with demonstrated line widths in the 30–40 micrometer range was successfully formed on a-Si films using this technique. For these examples, the crystallization thermal budget was reduced to 650° C./5 minutes and still the grain size seen for 700° C. anneals of films without this surface treatment was obtained. The resistivity for these undoped films was in the mid 10$^5$ ohm-centimeter range. It was found that crystallization of the surface treated regions occurred at temperatures as low as 550° C. for 5 min; however, the large grain size was not obtained for such low temperatures. In this case, the film in the surface treated region was microcrystalline for the 550° C./5 min. RTA exposure. In all cases of surface treatment usage, the region of the film which was not treated with the ultra-thin Pd or Ni film was not crystallized at 650° C./5 min exposure or less. RTA resulted in patterned crystallized Si.

Let it be understood that the the foregoing description is only illustrative of the invention. Various alternatives and modifications can be devised by those skilled in the art without departing from the spirit of the invention. Accordingly, the present invention is intended to embrace all such alternatives, modifications and variances which fall within the scope of the appended claims.

What is claimed is:

1. A method for producing a polycrystalline silicon film, comprising the steps of:
   a. depositing an amorphous silicon film;
   b. depositing on said amorphous silicon film, a thin discontinuous film of a nucleating site forming material; and
   c. annealing the films by heating said films to a temperature below that which would anneal said amorphous silicon film without said film of nucleating site material thereon, whereby said deposited material allows formation of said polycrystalline silicon film at a lower anneal temperature.

2. The method of claim 1 wherein said nucleating site forming material is selected from the group consisting of palladium and nickel.

3. The method of claim 1 wherein said anneal temperature is below 700° C.

4. The method of claim 1 wherein said nucleating site forming material is deposited in a pattern on said amorphous silicon film.

5. The method of claim 4 wherein said annealing step raises the temperature of said film for sufficient time to anneal portions of said amorphous silicon film covered by said material pattern, said temperature and its time of application insufficient to anneal uncovered portions of said amorphous silicon film.

6. The method of claim 5 wherein said nucleating site forming material is selected from the group consisting of palladium and nickel.

7. The method of claim 6 wherein said raised temperature is approximately 650° C.

8. The method of claim 7 wherein said temperature is raised in an ambient of oxygen, for less than five minutes.

9. The method of claim 1, wherein said depositing of said thin discontinuous film is achieved by depositing said thin discontinuous film at a thickness of less than 50 angstroms whereby said thin discontinuous film is deposited as independent globules to form said nucleating sites.

10. A method for producing a polycrystalline silicon film, comprising the steps of:
   a. disposing a thin discontinuous film of a nucleating site forming material in contact with a surface of an amorphous silicon film; and
   b. annealing the films by heating said films to a temperature below that which would anneal said amorphous silicon film without said film of nucleating site material in contact therewith, whereby said nucleating site forming material allows formation of said polycrystalline silicon film at a lower anneal temperature.

11. The method of claim 9 wherein said nucleating site forming material is selected from the group consisting of palladium and nickel.

* * * * *